United States Patent [19]
Whitney

[11] Patent Number: 5,750,414
[45] Date of Patent: May 12, 1998

[54] METHOD OF FABRICATING A SEMICONDUCTOR DEVICE

[75] Inventor: David Whitney, San Jose, Calif.

[73] Assignee: Siemens Components, Inc., Iselin, N.J.

[21] Appl. No.: 329,796

[22] Filed: Oct. 26, 1994

Related U.S. Application Data

[63] Continuation of Ser. No. 128,423, Sep. 29, 1993, abandoned, and a division of Ser. No. 99,282, Jul. 29, 1993, abandoned.

[51] Int. Cl.⁶ ............................................. H01R 21/22
[52] U.S. Cl. .................. 437/154; 437/149; 437/958
[58] Field of Search .................. 437/154, 41, 958, 437/149

[56] References Cited

U.S. PATENT DOCUMENTS

| | | | |
|---|---|---|---|
| 4,172,260 | 10/1979 | Okabe et al. | 357/23 |
| 4,633,292 | 12/1986 | Fellinger et al. | 257/394 |
| 4,707,719 | 11/1987 | Whight | 257/489 |
| 4,892,838 | 1/1990 | Fisher et al. | 437/41 |
| 4,924,286 | 5/1990 | Ishihashi | 257/630 |
| 5,086,332 | 2/1992 | Nakagawa et al. | 257/409 |

FOREIGN PATENT DOCUMENTS

| | | | |
|---|---|---|---|
| 0656774 | 4/1965 | Belgium. | |
| 0069429 | 2/1982 | European Pat. Off. | 257/409 |
| 0461877 | 12/1991 | European Pat. Off. | 257/488 |
| 56-103463 | 8/1981 | Japan. | |
| 0080073 | 3/1989 | Japan | 257/487 |

OTHER PUBLICATIONS

Imaizumi et al., "Novel IC Structure for 150V High–Voltage Consumer IC", IEEE Transactions on Consumer Electronics, vol. CE–26, No. 3 (Aug. 1980), pp. 367–374.

Manchanda et al., "A High–Performance Directly Insertable Self–Aligned Ultra–Rad–Hard and Enhanced Isolation Field–Oxide Technology for Gigahertz Silicon NMOS/CMOS VLSI", IEEE Transactions on Electron Devices, vol. 36, No. 4 (Apr. 1989), pp. 651–658.

B.J. Baliga, "Field Plates", Modern Power Devices, John Wiley & Sons, Inc. (1987), pp. 116–119.

*Primary Examiner*—Jey Tsai
*Attorney, Agent, or Firm*—Joseph S. Codispoti

[57] ABSTRACT

An integrated circuit (IC) (20) is formed on a semiconductor substrate (21). The IC has a PN junction (28) and a graded junction termination (27). A reverse field plate (31) is mounted adjacent the junction termination. One end of the field plate is mounted on and electrically connected to the substrate; the remainder of the field plate extends over a passivating oxide layer (30) which covers the substrate surface (29) adjacent the junction termination. The field plate provides a common potential surface which maintains a fixed potential on the substrate surface at the junction termination.

2 Claims, 2 Drawing Sheets

METHOD OF FABRICATING A SEMICONDUCTOR DEVICE

CROSS-REFERENCE TO RELATED APPLICATION

This is a continuation of Ser. No. 08/128,423 filed Sep. 29, 1993, abandoned, and a divisional of Ser. No. 08/099,282 filed Jul. 29, 1993, abandoned.

BACKGROUND OF THE INVENTION

1. Field of the Invention

The invention relates to the field of solid state electronics and, particularly, to a method of fabricating a semiconductor device and a device so formed.

2. Description of the Existing Art

Typical semiconductor device manufacturing processes produce junctions between differently doped portions of a semiconductor substrate. Various arrangements of these differently doped portions form specific types of semiconductor devices such as diodes, transistors, and the like. FIG. 1 shows a cross-section of a portion of semiconductor device 10 having PN junction 11 which is formed when a layer of $P^+$ doped material is deposited into substrate 12 of $N^-$ doped material. Specifically, junction 11 is formed between $N^-$ substrate 12 and $P^+$ layer 13.

Typically, during use of device 10 junction 11 alternatingly becomes forward and reversed biased as a result of a biasing voltage ± V. When junction 11 is reverse biased, the biasing voltage generates a relatively large electric field across the junction. Furthermore, the reverse bias forms a relatively wide transition region 14 within which the electric field is generated. However, transition region 14 does not have uniform width along the length of junction 11. For example, in those semiconductor devices where a diffused layer ends abruptly at a planar surface, the transition region is significantly narrower near the planar surface of the semiconductor substrate than within the substrate. Such narrowing of the transition region is caused by a natural accumulation of positive charges on oxide layer 17 (assuming for the moment that plate 18 and oxide layer 19 are not part of device 10). This case is depicted in FIG. 1 by dashed lines A and B. Specifically, if $P^+$ layer 13 ends abruptly so that junction 11 follows dashed line A, the boundary of transition region 14 would follow dashed line B. Since the electric field is bounded by transition region 14, the electric field across junction 11 is much greater near the semiconductor surface than is the electric field across junction 11 within semiconductor 12. In some device applications, the reverse bias voltage and its corresponding electric field can become large enough to cause junction breakdown near the surface of the semiconductor substrate while that same magnitude voltage has no effect upon the junction within the semiconductor substrate.

To avoid junction breakdown, the transition region near the surface of the substrate is typically graded to widen the transition region at the planar surface. Graded junctions are implemented by diffusing a relatively lightly doped material (doped lighter than the $P^+$ material) at the junction and near the semiconductor surface. For the FIG. 1 example, junction 11 is formed between $N^-$ substrate 12 and $P^+$ layer 13, $P^-$ layer 15 and $P^{--}$ layer 16. As such, the boundary of transition region 14 follows dashed line C. In this manner, transition region 14 is widened to lessen the electric field across junction 11 near the substrate surface. Such graded junctions are known in the art as graded termination structures. Typically, to complete the device, the termination structure as well as the semiconductor device surface is coated with insulating or passivating layer 17.

This termination technique reduces premature junction breakdown by gradually reducing the voltage at the surface over a wide transition region, thereby avoiding abrupt potential changes at the substrate surface. Essentially, a graded junction termination is designed so that the electric field at the surface is distributed over a wide transition region. However, a graded termination can be susceptible to surface charges both in and on the passivating or insulating material forming the passivating layer. Such surface charges, which can be the result of dust, water vapor, surface impurities, and the like that fall upon the substrate during processing, can alter and distort the desired electric-field distribution at the substrate surface. The electric field distortion can cause abrupt potential changes at the substrate surface, thus limiting the effect of the graded junction termination. Such abrupt potential changes cause currents, possibly in destructive amounts, to flow through the termination structure. Consequently, surface charges near a graded termination can significantly contribute to premature junction breakdown.

To render graded junction terminations less susceptible to surface charges, so-called field plates are mounted over the passivating layer and adjacent the termination structure. FIG. 1 shows conventional field plate 18, which is a conductive member having one end shorted to $P^+$ layer 13 and its other end extending over passivating layer 17 above the graded termination structure formed by $P^{30}$ layer 13, $P^-$ layer 15 and $P^{--}$ layer 16. In this manner, field plate 18 has the same potential as $P^+$ layer 13. Hence, conductive field plate 18 provides a uniform potential which is superimposed over the graded junction termination. The presence of this uniform potential "stabilizes" the junction termination by fixing the potential at the substrate surface. Surface charges that accumulate on passivating layer 19, which is formed above field plate 18, cannot penetrate the field plate. As a result, field plate 18 renders the junction termination less susceptible to premature breakdown due to surface charge.

Although the use of field plates has generally served the purpose, it has not always been an acceptable solution to surface charge induced junction breakdown for at least two reasons. First, access to the diffused layer (e.g., $P^+$ layer 13) for mounting a field plate may not always be practical or possible due to circuit layout or device complexity. Second, because the field plates are individually shorted to surfaces (diffused layers) that carry relatively high voltages which vary with respect to one another, the field plates must be properly spaced from one another to obtain sufficient electrical isolation between adjacent plates. This requirement can be a significant drawback when a large number of field plates is to be mounted on a common substrate in close proximity to one another.

SUMMARY OF THE INVENTION

To remedy the deficiencies in the art, the present invention teaches the use of a unique reverse field plate, junction-terminating structure and a method of fabricating such a field plate. The invention reverses the orientation of a field plate (hereinafter referred to as a "reverse" field plate) with respect to the termination structure as compared to that employed in the aforementioned existing art.

Specifically, the reverse field plate is connected (shorted) to the semiconductor substrate rather than a diffused layer as in the existing art. As such, the reverse field plate does not occupy surface area above the diffused layer. Consequently, the surface area above the diffused layer may be used for placement of other, more complex semiconductor structures. Also, by connecting several closely spaced reverse field plates to the substrate, the reverse field plates are all maintained at a substantially common potential level, thereby making electric isolation of the plates less critical than in the prior art.

These features arising from the use of the invention advantageously permit a greater component density to be achieved on the semiconductor substrate, thereby solving one of the most critical problems confronting integrated circuit designers, viz. reduction of integrated circuit size.

In one embodiment, the present invention comprises a semiconductor device having a semiconductor substrate with a layer of doped impurities (diffused layer) extending a predetermined depth from the surface into the substrate to form a semiconductor junction and a junction termination. An insulating layer is formed on the surface of the substrate and covers the junction termination. A conductive plate has a first portion electrically connected to the substrate at a location spaced laterally from the layer of doped impurities, and a second portion extending over the insulating layer adjacent the junction termination. The potential of the conductive plate, essentially equivalent to the potential of the substrate, is superimposed on the junction termination to "stabilize" the surface potential.

In a second embodiment, the present invention includes an integrated circuit which is formed on a semiconductor substrate. The integrated circuit includes a PN junction and a graded junction termination. A reverse field plate is mounted adjacent the junction termination. One portion of the field plate is electrically connected to the substrate; another portion of the field plate extends over a passivating oxide layer which covers the substrate surface adjacent the junction termination. The field plate provides a potential surface which maintains a fixed potential on the substrate surface at the junction termination.

In both embodiments, since the potential on the conductive plate or the field plate is essentially equivalent to the potential of the substrate, electrical isolation of multiple plates on a common substrate is accomplished using relatively small spacings between plates.

Additionally, the present invention is directed to a semiconductor fabrication method wherein a PN junction having a graded termination structure is diffused into a semiconductor substrate. A passivating layer is formed on a surface of the substrate adjacent the termination structure. A conductive field plate is deposited such that a first portion of the conductive field plate is deposited on the substrate while a second portion is deposited over the passivating layer.

BRIEF DESCRIPTION OF THE DRAWINGS

The teachings of the invention can be readily understood by considering the following detailed description in conjunction with the accompanying drawing, in which.

DETAILED DESCRIPTION OF THE PREFERRED EMBODIMENT

Figure 1:
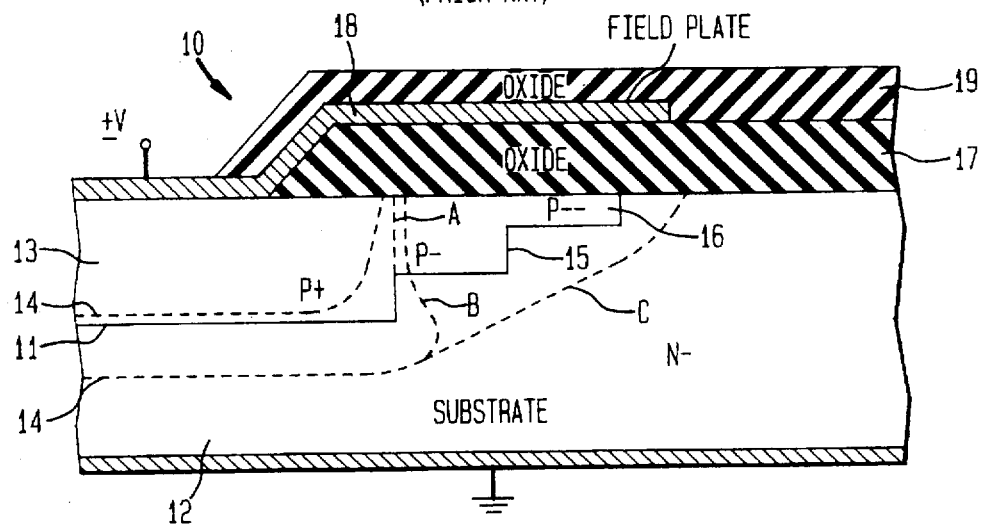
FIG. 1 is a cross-sectional view of a portion of an existing semiconductor device.
Figure 2:
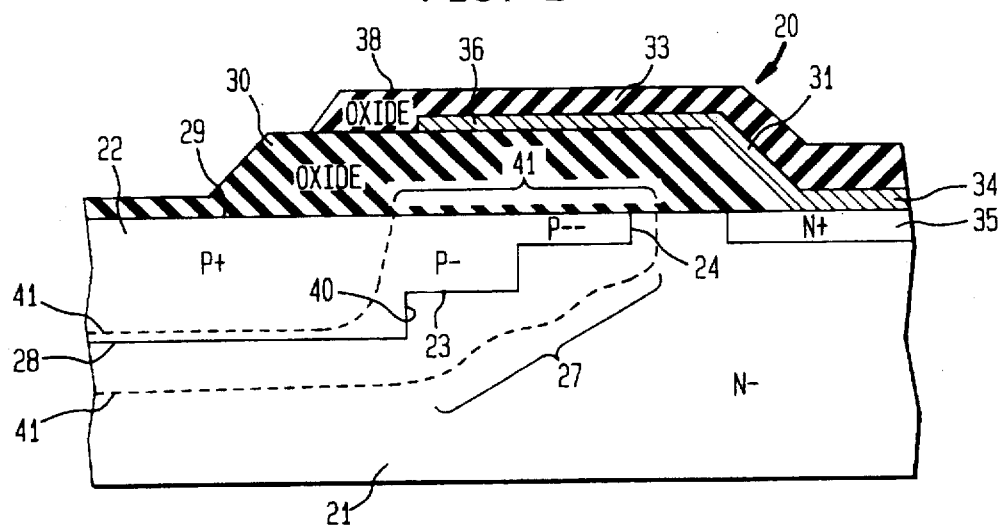
FIG. 2 is a cross-sectional view of a portion of semiconductor integrated circuit 20 fabricated in accordance with the present invention and taken along lines 2—2 shown in FIG. 3.
Figure 3:
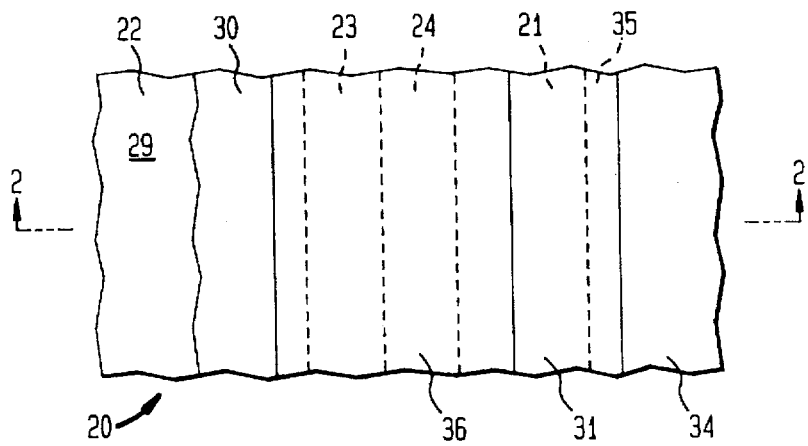
FIG. 3 depicts a top plan view of the portion of semiconductor integrated circuit 20 depicted in FIG. 2.

To best understand the invention, it is recommended that the reader simultaneously refer to both FIGS. 2 and 3 while reading the following description.

Typically, a simple semiconductor device contains a substrate of one type of semiconductor material and a layer diffused therein formed of another type of semiconductor material. Additionally, a graded junction termination is typically formed near the surface of the substrate, along a junction between the substrate and the diffused layer. A passivating layer is formed over, at least, the graded junction termination. In general, the inventive method forms a field plate that is electrically connected at one end to the substrate and the other end of the field plate extends over the passivating layer. The passivating layer electrically insulates the field plate from the junction termination. Another (second) passivating layer is then formed over the field plate. In operation, the field plate isolates any surface charges that accumulate on the passivating layer from distorting the electrical characteristics of the junction termination.

Specifically, FIG. 2 depicts a cross-section of a portion of integrated circuit 20 having semiconductor substrate 21 which is lightly doped with N type impurities. FIG. 3 depicts a top plan view of the portion of integrated circuit 20 depicted in FIG. 2.

As shown, $P^+$ layer 22 is formed by highly doping upper surface 29 of substrate 21 to form PN junction 28. At terminating end 40 of $P^+$ layer 22, a graded junction termination 27 is formed by grading and decreasing the P type impurities to form two graded regions, e.g., $P^-$ region 23 and $P^{--}$ region 24. Specifically, $P^-$ region 23 is formed by moderately doping a relatively small region of surface 29 adjacent end 40 of layer 22 with P type impurities such that the impurity concentration and layer thickness are less than that of layer 22. Likewise, $P^{--}$ region 24 is formed by lightly doping another relatively small region of surface 29 adjacent $P^-$ region 23 with P type impurities such that the impurity concentration and layer thickness are less than that of $P^-$ region 23. A passivating oxide layer 30 is formed on a portion of surface 29 to at least cover junction termination 27.

PN junction 28 may be used in integrated circuit 20 as a simple unijunction diode or, in conjunction with other semiconductor components (not shown), it may be part of a more complex device such as a silicon controlled rectifier, a bipolar transistor, a field effect transistor, and the like. In this regard, such other integrated components would be conventional and are located on either side of, or to the rear and front of the structure shown in FIG. 2. The placement of such other components are within the knowledge of those skilled in these arts.

Furthermore, the doping methods, used to fabricate layer 22 and regions 23 and 24, can include any conventional doping process including diffusion. Such diffusion can be performed in three steps as follows: first, P type impurities are lightly diffused to a first, shallow depth to form layer 22 and regions 23 and 24; next, region 24 is masked, and P type impurities are diffused to a deeper depth and at a higher concentration; and finally, regions 23 and 24 are masked, and $P^+$ layer 22 is formed by heavy diffusion of P type impurities to a greater depth. Of course, those skilled in the art can use other diffusion and/or doping methods based on the present teachings to produce layer 22 and regions 23 and 24. Also, termination 27 can be graded continuously, as opposed to being graded in steps as described above.

When PN junction 28 is reverse biased, a relatively high potential difference can appear at surface 29 and across junction termination 27. Specifically, this potential difference extends across termination 27 from $P^+$ layer 22 to substrate 21. The graded configuration of termination 27 achieves so-called high-voltage, reverse-bias blocking by gradually reducing this high potential difference over relatively wide transition region 41. However, it is widely recognized that surface charges, which accumulate on passivating materials of an integrated circuit, adversely distort this gradual reduction of the surface potential. In particular, such surface charges interfere with the uniformity of the electric field across the transition region at the surface of the substrate. As such, the surface charges can cause the potential across the transition region to increase at certain points and decrease at others. Such fluctuations in potential may be detrimental to device operations and could lead to device failure. Specifically, those points of increased potential tend to generate excessive currents through the junction which cause junction breakdown. To prevent such surface charge induced breakdown, integrated circuit 20 includes conductive field plate 31 which superimposes a uniform surface potential upon termination 27.

Field plate 31 contains first portion 34 that is joined to surface 29 of N⁻ substrate 21 while second portion 36 of the field plate is deposited upon oxide layer 30. Field plate 31, which is formed of a conductive material such as polysilicon, extends over termination 27. Specifically, portion 36 of field plate 31 extends over the entire length of junction termination 27 but not over highly doped region 28. Field plate 31 is passivated with insulating oxide layer 33 having exterior surface 38. In FIG. 3, oxide layer 33 is not depicted such that the underlying field plate 31 is clearly depicted. Portion 34 of field plate 31 is joined to N⁻ substrate 21 via N⁺ layer 35. In a well-known manner, the N type impurities of N⁺ layer 35 can be diffused into surface 29 via a conventional diffusion process, or they can simply be created as a result of the application of conductive field plate 31 to substrate 21.

The orientation of field plate 31 is reversed from conventional practice inasmuch as the plate is mounted on and electrically connected to substrate 21 rather than on diffused layer 22 as conventionally taught. Field plate 31 operates to maintain a fixed potential on surface 29 in the area of termination 27. Also, any electric fields that are associated with surface charges that may accumulate on exterior surface 38 of oxide layer 33 cannot penetrate field plate 31. Consequently, field plate 31 is a surface potential stabilizing structure because the plate essentially shields termination 27 from the effects of surface charges.

Figure 4:
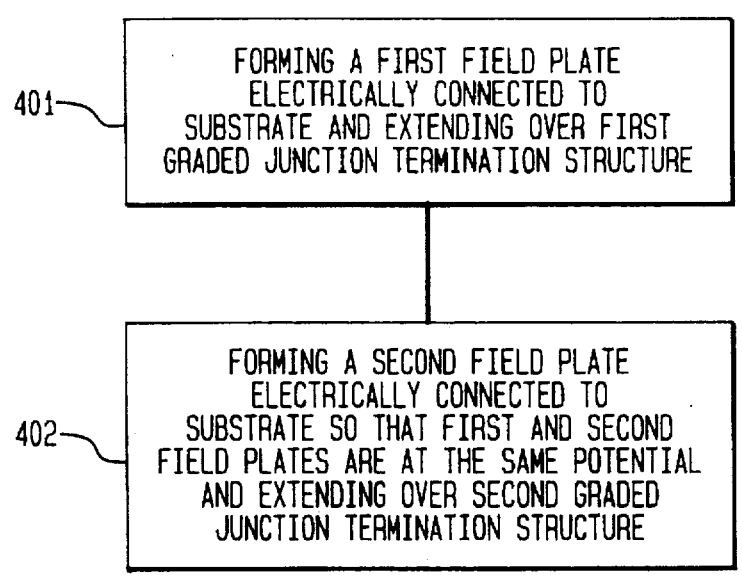
FIG. 4 is a flow chart of a method of the present invention.

The inventive teachings for fabricating and using a reverse field plate provides the integrated circuit designer with an additional field-plate mounting option. The invention may be used for plate mounting when access to a diffused layer, such as P⁺ layer 22, is not practical, i.e., when additional layers are to be formed upon the diffused layer. Also, because all such field plates 31 on an integrated circuit (IC) are essentially at a common potential, i.e., the potential of substrate 21, electrical isolation of plates 31 is readily achieved. In those situations where a number of field plates 31 are to be mounted on an integrated circuit, a first field plate can be formed, as shown in FIG. 4, at a step 401, with a first portion joined to the surface of substrate 21 and a second portion upon oxide layer 30 and extending over graded junction termination structure 27. A second field plate can similarly be formed, at a step 402, with a first portion electrically connected to the substrate so that the second field plate is at the same potential as the first field plate, and with a second portion extending over a second graded termination structure. Accordingly, the plates can be spaced more closely to each other when using the invention than is usually possible when each plate is connected to a different high-potential surface, e.g., a diffused layer. Decreasing required plate spacing has the important beneficial effects of decreasing device size and/or cost.

Obviously many modifications and variations of the present invention are possible in the light of the above teachings. It is to be understood, therefore, that within the scope of the appended claims, the present invention can be practiced otherwise than as specifically described.

What is claimed is:

1. A method of fabricating a semiconductor device comprising:

diffusing a layer of doped impurities into a surface of a semiconductor substrate and forming a semiconductor junction and a graded junction termination structure;

forming an insulating layer on said surface to cover said graded junction termination structure; and forming a conductive field plate including depositing a first portion of said field plate on said substrate at a location spaced from said layer of doped impurities and a second portion of said field plate on said insulating layer adjacent said graded junction termination structure, whereby the plate potential provided by said field plate during operation is superimposed on said graded junction termination structure, wherein said graded junction termination structure includes at least one heavily doped P+ region which forms said pn junction, at least one lightly doped P— region and a lightly doped P— region located between said P+ region and said P— region, each said P+, P— and P— region having different depths from one another.

2. The method of claim 1 wherein said different depths are such that said P— region is deeper than said P— region and is shallower than said P + region.

* * * * *